(12) United States Patent
Liu et al.

(10) Patent No.: US 12,126,327 B2
(45) Date of Patent: Oct. 22, 2024

(54) SEMICONDUCTOR DEVICE, COMMUNICATION APPARATUS, AND PRODUCING METHOD THEREOF

(71) Applicant: Suzhou HunterSun Electronics Co., Ltd., Suzhou Nano (CN)

(72) Inventors: Hairui Liu, Suzhou Nano (CN); Zhiguo Lai, Suzhou Nano (CN); Qinghua Yang, Suzhou Nano (CN)

(73) Assignee: SUZHOU HUNTERSUN ELECTRONICS CO., LTD., Suzhou Nano (CN)

( * ) Notice: Subject to any disclaimer, the term of this patent is extended or adjusted under 35 U.S.C. 154(b) by 0 days.

(21) Appl. No.: 18/222,532

(22) Filed: Jul. 17, 2023

(65) Prior Publication Data
US 2024/0120903 A1   Apr. 11, 2024

(30) Foreign Application Priority Data

Jul. 20, 2022   (CN) .......................... 202210855430.6

(51) Int. Cl.
  *H03H 9/54*   (2006.01)
  *H03H 9/02*   (2006.01)
  *H03H 9/05*   (2006.01)
(52) U.S. Cl.
  CPC ........ *H03H 9/542* (2013.01); *H03H 9/02125* (2013.01); *H03H 9/0514* (2013.01)
(58) Field of Classification Search
  CPC ... H03H 9/542; H03H 9/02125; H03H 9/0514
  (Continued)

(56) References Cited

U.S. PATENT DOCUMENTS 8,013,692 B2   9/2011   Haruta
2013/0321102 A1   12/2013   Iwaki
(Continued)

FOREIGN PATENT DOCUMENTS

CN   102067447 A   5/2011
CN   110504942 A   11/2019
(Continued)

OTHER PUBLICATIONS

International Search Report Corresponding to International Patent Application No. PCT/CN2022/143495, mailed Mar. 20, 2023.
(Continued)

*Primary Examiner* — Rakesh B Patel
*Assistant Examiner* — Jorge L Salazar, Jr.
(74) *Attorney, Agent, or Firm* — Harness, Dickey & Pierce, P.L.C.

(57) ABSTRACT

A semiconductor device including a first functional module arranged on a first substrate and having a chip, an electrical connection component and a sealing ring, where the sealing ring surrounds the chip, and the chip is electrically connected to the electrical connection component; a second functional module having a packaging substrate, where the packaging substrate includes at least two metal layers and a dielectric layer between the metal layers; a third functional module having multiple redistribution lines and multiple micro through holes for electrical connection between the first functional module and the second functional module, where the electrical connection component in the first functional module is electrically connected to the third functional module; and a second substrate, where the second substrate is sealed with the first substrate.

21 Claims, 7 Drawing Sheets

(58) Field of Classification Search
USPC .................. 333/133, 187, 188, 193–196
See application file for complete search history.

(56) References Cited

U.S. PATENT DOCUMENTS

2019/0132942 A1* 5/2019 Yun .................. H05K 1/0233
2021/0098558 A1    4/2021 Chen et al.

FOREIGN PATENT DOCUMENTS

| CN | 111464148 A | 7/2020 |
|---|---|---|
| CN | 111697938 A | 9/2020 |
| CN | 112599532 A | 4/2021 |
| CN | 113411069 A | 9/2021 |
| CN | 114465601 A | 5/2022 |
| CN | 216451349 U | 5/2022 |
| CN | 114671395 A | 6/2022 |
| CN | 115021711 A | 9/2022 |
| JP | 2011071256 A | 4/2011 |

OTHER PUBLICATIONS

Chinese Office Action Corresponding to Application No. 202210855430.6, mailed Sep. 15, 2022.
Extended European Search Report Corresponding to Application No. 23185835.8, mailed Mar. 5, 2024.
Yin Xiangkun et al: Ultra-Compact TSV-Based L-C Low-Pass Filter With Stopband Up to 40 GHz for Microwave Application,IEEE Transactions on Microwave Theory and Techniques, IEEE, USA vol. 67, No. 2, Feb. 2019 (Feb. 2019), pp. 738-745,XP011708195 [retrieved on Feb. 4, 2019].

* cited by examiner

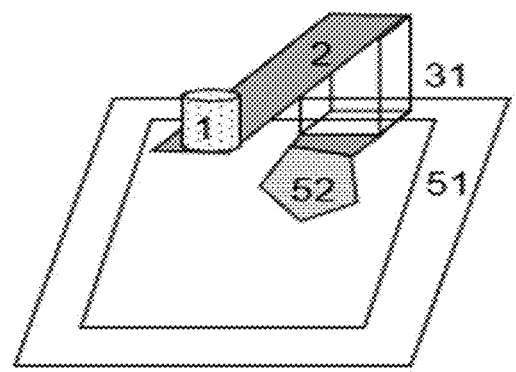
Figure 3    (PRIOR ART)
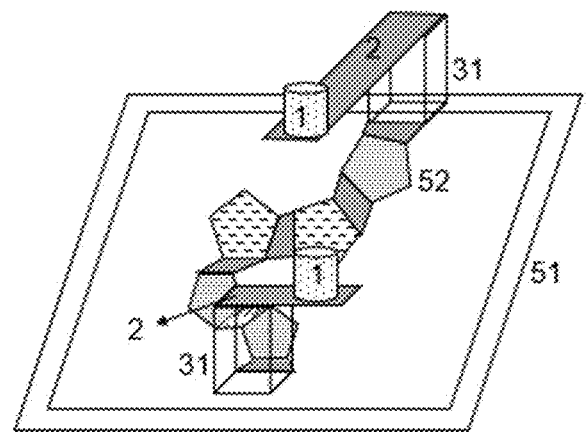
Figure 4    (PRIOR ART)
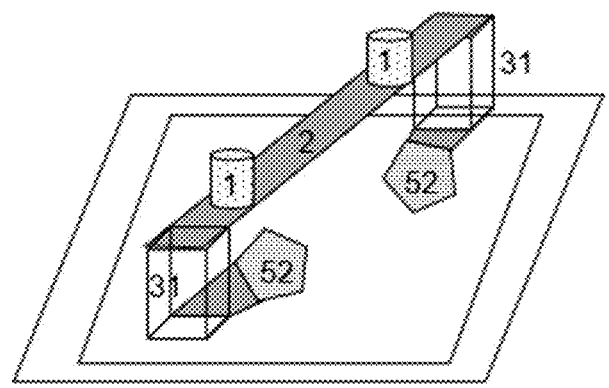
Figure 5    (PRIOR ART)

SEMICONDUCTOR DEVICE, COMMUNICATION APPARATUS, AND PRODUCING METHOD THEREOF

CROSS REFERENCE TO RELATED APPLICATIONS

This application claims priority to Chinese Patent Application No. 202210855430.6, filed on Jul. 20, 2022, which is incorporated herein by its reference in its entirety.

FIELD

The present disclosure relates to a communication apparatus and a producing method thereof, and in particular to a communication apparatus with a semiconductor device and a producing method thereof.

BACKGROUND

An RF front-end is a core component in a mobile communication apparatus, and a filter is the most important component in the RF front-end. The filter is mainly used to allow signals in a certain frequency band to pass while suppressing signals in other frequency bands. Filter products are developed mainly in order to have low power consumption, a low cost, and a high performance. In terms of low cost, existing technologies manufacture filters by wafer-to-wafer bonding, mature TSV processes, electroplating processes, and silicon processes, which significantly reduce the cost and volume of filters. In terms of high performance, the demand for filters with high out-of-band suppression is increasing in modern communications. When selecting a filter, the factors to be considered include edge roll-off, a high-quality factor (high Q value), out-of-band suppression, and insertion loss. The parasitic inductors generated by redistribution lines and through holes in the filter greatly affect the edge roll-off of the filter.

An existing bulk acoustic wave filter is shown in FIG. 1. The bulk acoustic wave filter 10 includes a signal input port 131, a signal output port 132, and multiple series resonant arms connected between the signal input port and the signal output port. Multiple parallel resonant arms are connected between adjacent series resonant arms. Each of the series resonant arms includes a bulk acoustic wave resonator, such as resonators 11 to 14 shown in FIG. 1. Each parallel resonant arm includes a bulk acoustic wave resonator, such as resonators 111 to 113 shown in FIG. 1. Furthermore, each parallel resonator has one end connected between two series resonant arms, and the other end grounded through an inductor (such as inductors 123-125 shown in FIG. 1). The inductor 123-125 may include at least one inductor having a very small inductance, which may be less than 0.1 nH, for example. This inductance is less than the parasitic inductance in a conventional redistribution line layout, resulting in the disappearance of some zero points, and thus affecting the suppression near to a passband or affecting the isolation of a diplexer and a multiplexer.

The low-cost produced structure of the RF filter using existing technology is shown in FIG. 2. The existing structure of the RF filter includes a substrate 4, a protective cap wafer 3, and a filter wafer 5. The filter wafer 5 is arranged with bulk acoustic wave resonators 52, and a metal sealing ring 51 is formed on the periphery of the bulk acoustic filter. The metal sealing ring 51 and the bulk acoustic filters can be electrically connected to the substrate 4 through metallized via holes 31, redistribution lines 2, and bumps 1 on the protective cap wafer. The metal sealing ring 51 provides an enclosure protection for the bulk acoustic wave resonators 52 constituting the bulk acoustic wave filter, to prevent gas, liquid, or the like from contaminating the filter. The substrate 4 is formed by multiple layers of metal and dielectric, and provides a grounding winding inductor for the parallel resonant arms by wound metal lines.

FIGS. 3 and 4 are structural perspective views of some parts of the filter in FIG. 2. As shown in FIGS. 3 and 4, the micro bump 1, the redistribution line 2, and the metallized through hole 31 filled with metal materials not only provide electrical connections of the substrate with the metal sealing ring 51 and the bulk acoustic wave resonators 52 on the filter wafer, but also introduce additional inductances, causing the inductance of the parallel resonant arm connected in series with the resonator to be greater than a required inductance, thereby attenuating the out-of-band suppression near to a passband, especially when adjacent frequency bands are very close, such as the 2.4 GHz WiFi and B40 frequency bands, and the 2.4 GHz WiFi and B7Tx frequency bands. For a diplexer or multiplexer, this additional inductance will also significantly weaken the isolation, reducing the overall performance of the device.

In addition, as shown in FIG. 5, when two or more parallel resonant arms need to be directly grounded together and bulk acoustic wave resonators 52 on the parallel resonant arms are far away from each other, the redistribution line 2 is very long, which introduces additional inductance. Therefore, even if two or more micro bumps 1 are used in this case, it is difficult to achieve high suppression near to a passband.

In order to address the above technical problem, a novel RF filter structure is provided in the present disclosure, which utilizes a novel layout design of micro bumps, redistribution lines, micro through holes, and the sealing ring to reduce parasitic inductance, so as to reduce the inductance connected in series with the parallel resonant arms, thereby improving the edge roll-off of the filter device, and enhancing the suppression near to a passband of the filter and/or the isolation of a diplexer and a multiplexer.

SUMMARY

In the followings, a brief overview of the present disclosure is provided to provide a basic understanding of some aspects of the present disclosure. It should be understood that this overview is not an exhaustive overview of the present disclosure. It is neither intended to identify the key or important parts of the present disclosure, nor intended to limit the scope of the present disclosure. The purpose is only to provide some concepts in a simplified form as a prelude to a more detailed description.

According to an aspect of the present disclosure, a semiconductor device is provided, comprising: a first functional module arranged on a first substrate and comprising a chip, an electrical connection component and a sealing ring, where the sealing ring surrounds the chip, and the chip is electrically connected to the electrical connection component; a second functional module comprising a packaging substrate, where the packaging substrate comprises at least two metal layers and a dielectric layer between the metal layers; a third functional module comprising multiple redistribution lines and multiple micro through holes used for electrical connection between the first functional module and the second functional module, where the electrical connection component in the first functional module is electrically connected to the third functional module; and a second substrate, where the second substrate is sealed with the first substrate, where at least two of the multiple redistribution lines intersect with each other, at least one of the micro through holes is electrically connected to the second functional module through at least two different redistribution lines, the second functional module is electrically connected to the chip through the multiple redistribution lines, the multiple micro through holes and the electrical connection component.

According to another aspect of the present disclosure, a producing method for a semiconductor device, comprising: a producing process of a first functional module, comprising forming a chip, an electrical connection component and a sealing ring on a first substrate, where the sealing ring surrounds the chip, and the chip is electrically connected to the electrical connection component; a producing process of a second functional module, comprising providing a packaging substrate, where the packaging substrate comprises at least two metal layers and a dielectric layer between the metal layers; a producing process of a third functional module, comprising forming multiple redistribution lines and multiple micro through holes used for electrical connection between the first functional module and the second functional module, where the electrical connection component in the first functional module is electrically connected to the third functional module; and providing a second substrate, where the second substrate is sealed with the first substrate, where at least two of the multiple redistribution lines intersect with each other, at least one of the micro through holes is electrically connected to the second functional module through at least two different redistribution lines, the second functional module is electrically connected to the chip through the multiple redistribution lines, the multiple micro through holes and the electrical connection component.

In an embodiment, the third functional module is arranged on the second substrate, the multiple micro through holes of the third functional module are arranged in the second substrate, the multiple redistribution lines are arranged on a surface of the second substrate away from the first substrate, the multiple redistribution lines are provided with at least one micro bump, and the multiple redistribution lines are electrically connected to the second functional module through the micro bump.

In an embodiment, the third functional module is arranged on the first substrate, the multiple micro through holes of the third functional module are arranged in the first substrate, the multiple redistribution lines are arranged on a surface of the first substrate without the first functional module, the multiple redistribution lines are provided with at least one micro bump, and the multiple redistribution lines are electrically connected to the second functional module through the micro bump.

In an embodiment, the multiple redistribution lines at least comprise a first redistribution line, a second redistribution line, and a third redistribution line; a first part of the first redistribution line, a first part of the second redistribution line, and a first part of the third redistribution line converge on a first surface of a same micro through hole; and a second part of the first redistribution line, a second part of the second redistribution line and a second part of the third redistribution line are electrically connected to the second functional module through the micro bump.

In an embodiment, any one of the electrical connection component and the micro through holes is electrically connected to the sealing ring or not electrically connected to the sealing ring.

In an embodiment, the multiple micro through holes comprise at least one first independent micro through hole and a second micro through hole; a surface of the first independent micro through hole is electrically connected to the sealing ring and is not electrically connected to the electrical connection component; a surface of the second micro through hole is electrically connected to the electrical connection component and the sealing ring; another surface of the first independent micro through hole is electrically connected to another surface of the second micro through hole through at least one redistribution line; and at least two micro bumps are arranged on a redistribution line between the first independent micro through hole and the second micro through hole.

In an embodiment, the chip is an acoustic wave device chip.

In an embodiment, the acoustic wave device chip comprises multiple bulk acoustic wave resonators.

In an embodiment, an element and a grounding layer are arranged in the metal layers of the packaging substrate, and one of the at least two different redistribution lines is connected to the element arranged in the metal layers through a micro bump, where the other one of the at least two different redistribution lines is connected to the grounding layer arranged in the metal layers through another micro bump; or the other one of the at least two different redistribution lines is connected to a first inductor arranged in the metal layers through another micro bump, and then connected to the grounding layer.

In an embodiment, a grounding layer is arranged in the metal layers of the packaging substrate, and one of the at least two different redistribution lines is connected to the grounding layer arranged in the metal layers through a micro bump, where the other one of the at least two different redistribution lines is connected to the grounding layer arranged in the metal layers through another micro bump; or the other one of the at least two different redistribution lines is connected to a first inductor arranged in the metal layers through another micro bump, and then connected to the grounding layer.

In an embodiment, the element is a second inductor.

According to another aspect of the present disclosure, a communication apparatus is provided, comprising the semiconductor device according to any one of the above embodiments.

The technical solution of the present disclosure can achieve at least one of the following effects. The additional inductance brought by the micro bumps, redistribution lines, and silicon through holes filled with metal materials can be reduced. The out-of-band suppression near to a passband of the filter can be enhanced. The isolation of a diplexer and a multiplexer can be enhanced. The design of redistribution lines and micro through holes can not only achieve electrical connection between the substrate and the parallel resonators, but also reducing parasitic inductance, thereby reducing the inductance connected in series with the parallel resonant arms and improving the edge roll-off.

BRIEF DESCRIPTION OF THE DRAWINGS

The present disclosure is described with reference to the accompanying drawings, for better understanding of the above and other purposes, characteristics, and advantages of the present disclosure. The accompanying drawings are only intended to illustrate the principles of the present disclosure.

The dimensions and relative positions of the units are not necessarily to be in proportion in the accompanying drawings.

FIGS. 3 to 5 are perspective views of partial structures of a filter in the conventional technology;

DETAILED DESCRIPTION OF EMBODIMENTS

In the followings, examples of the present disclosure will be described in conjunction with the accompanying drawings. For clarity and conciseness, not all features for implementing the present disclosure are described in the specification. However, it should be understood that in the process of developing any implementation of this disclosure, many decisions specific to this disclosure can be made to achieve specific goals of developers, and these decisions may vary depending on the content of this disclosure.

Here, it should also be noted that in order to avoid obscuring the present disclosure due to unnecessary details, only device structures closely related to the solutions of the embodiments are illustrated in the accompanying drawings, and other details having less relationship to the embodiments are omitted.

It should be understood that the present disclosure is not limited to the described embodiments by the following description with reference to the accompanying drawings. In the present disclosure, as long as feasible, features in different embodiments may be replaced or borrowed, and one or more features can be omitted in an embodiment.

First Embodiment

Figure 1:
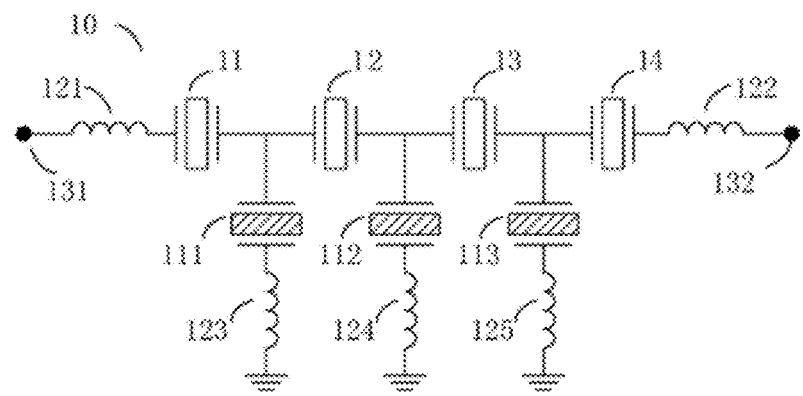
FIG. 1 is a schematic diagram of a circuit structure of a filter in the conventional technology.
Figure 2:
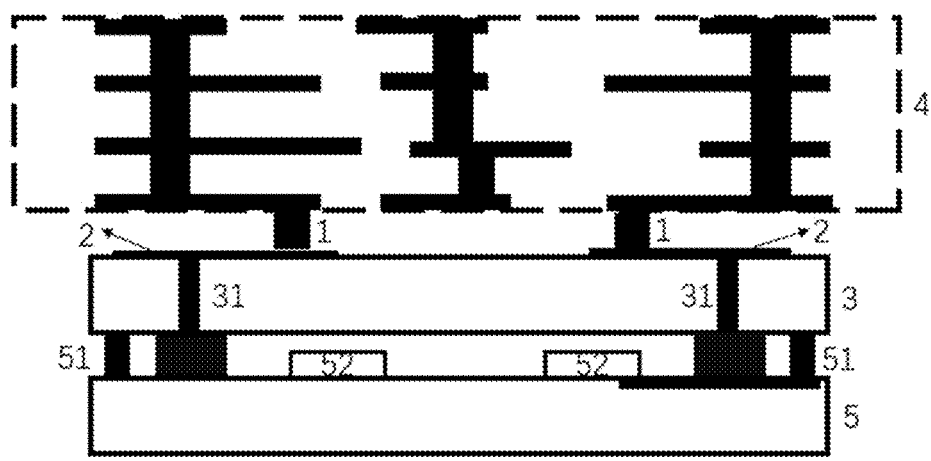
FIG. 2 is a cross-sectional view of a filter structure in the conventional technology.
Figure 6:
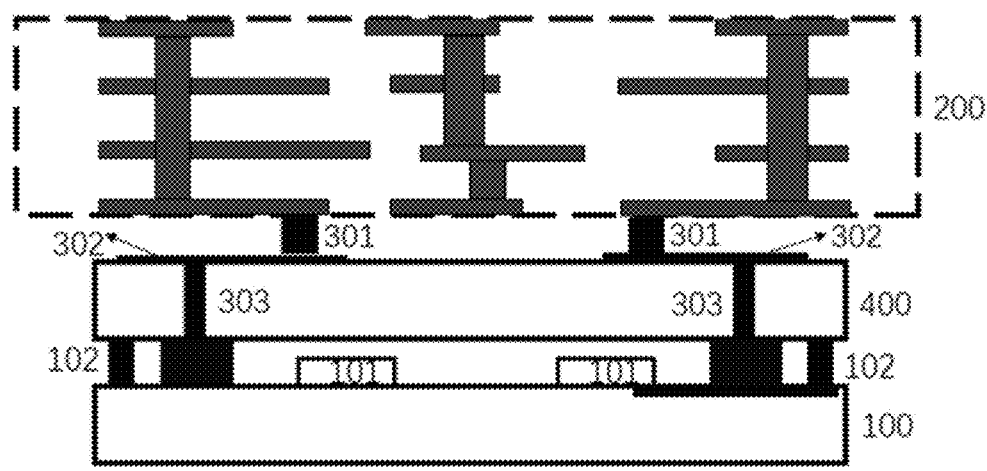
FIG. 6 is a cross-sectional view of a filter structure according to a first embodiment.
Figure 7:
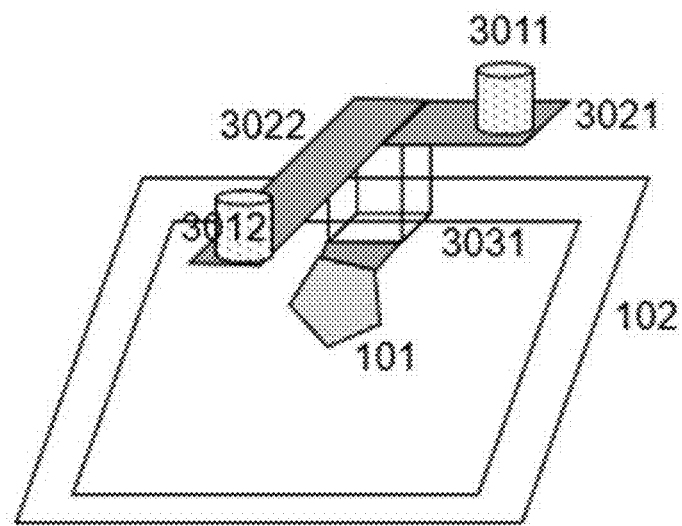
FIGS. 7 and 8 are perspective views of partial structures of a filter according to the first embodiment.
Figure 8:
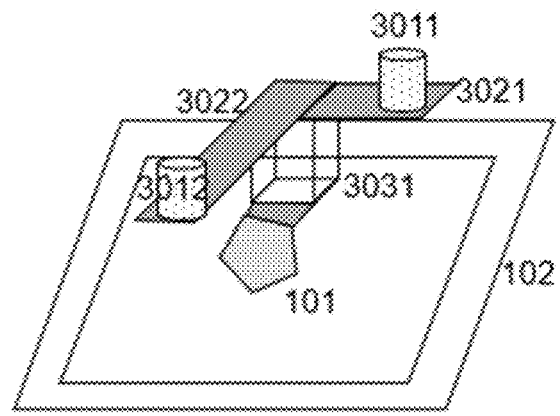

FIGS. 6 to 8 illustrate a filter structure and a method according to a first embodiment of the present disclosure, where the same reference numerals represent the same components.

As shown in FIG. 6, a first functional module is provided. For example the first functional module is formed on a first substrate 100. The first functional module includes at least one filter chip 101. For example, the structure of the filter chip 101 is a T-shaped structure. The T-shaped structure filter includes a signal input port, a signal output port, and multiple series resonant arms connected between the signal input port and the signal output port. Multiple parallel resonant arms are connected between the signal input port and the series resonant arms, between adjacent series resonant arms, and between the series resonant arm and the signal output port. The series resonant arms and the parallel resonant arms each include at least one resonator. The resonator may be a bulk acoustic wave resonator, a surface acoustic wave resonator, a resonator composed of LC circuits, or the like. It can be understood that the filter chip may be replaced by another type of chip. The present disclosure is not limited to the filter chip, and the filter chip is only taken as an example to describe the embodiments.

The first substrate is further provided with bonding pads, electrical connection components, and the like. Through the electrical connection components, the resonators on the first substrate are electrically connected to form a specific form of filter. It can be understood by those skilled that the filter may also be another type of filter, such as a π-type filter, as long as being capable of suppressing a signal in other frequency bands in a RF signal.

Furthermore, the first substrate further includes a sealing ring 102, which surrounds the filter, to protect the filter from external factors such as gas and liquid that may cause damage to the elements.

A second functional module is provided. For example, the second functional module is formed by a packaging substrate 200. The packaging substrate includes multiple metal layers and dielectric layers which are alternately arranged. For example, the packaging substrate is a printed circuit board or a high-temperature co-fired ceramic (HTCC) substrate. The metal layers are formed on the upper and/or lower surfaces of the dielectric layers. The dielectric layers are used for electrical insulation of the metal layers. Interconnection structures are formed in the dielectric layers. The multiple metal layers include at least a grounding layer. Furthermore, a first inductor and a second inductor may be arranged in the multiple metal layers. The formed second inductors each provide a grounding winding inductor for one of the multiple parallel resonant arms in the chip. A part of the metal layers are used as a common grounding layer to provide a common reference ground plane for the overall RF chip. Some of the inductors are connected to the common grounding layer through the interconnection structure.

A third functional module and a cover plate are provided. For example, the cover plate may be formed by a second substrate 400, and the third functional module is formed on the second substrate. The third functional module is used for electrically connecting the first functional module and the second functional module. In this embodiment, the third functional module includes multiple micro bumps 301, multiple redistribution lines 302, and multiple micro through holes 303. The second substrate is used to cooperate with the sealing ring to protect the filter from gas, liquid and the like. Furthermore, the multiple micro bumps 301 and the multiple redistribution lines 302 are formed on a first surface of the second substrate away from the first substrate. It can be understood that the second substrate may be a glass substrate or a silicon substrate. The multiple micro through holes 303 are formed in the second substrate. In an example, the sidewall of the silicon through hole has an insulation layer, a barrier layer, a metal seed layer, and a metal layer. It can be understood that the glass substrate has a barrier layer, a metal seed layer, and a metal layer on its sidewalls based on its insulation characteristics. Among the multiple redistribution lines, at least two redistribution lines intersect with each other. At least one of the multiple micro through holes is electrically connected to the second functional module through at least two different redistribution lines. The second functional module is electrically connected to the chip through the multiple redistribution lines, the multiple micro through holes and the electrical connection component.

It can be understood that the layout of the multiple micro bumps 301, the multiple redistribution lines 302, and the multiple micro through holes 303 can be designed as shown in FIGS. 7 and 8, in which a first part of a first redistribution line 3021 and a first part of a second redistribution line 3022 converge on a first surface of a micro through hole 3031 of a first parallel resonant arm, and the first and second redistribution lines intersect to each other. It can be understood that the above layout of the first and second redistribution lines and the micro through hole 3031 is only an example. The present disclosure only requires that parts of the intersecting first and second redistribution lines are converged on the first surface of the micro through hole 3031. Micro bumps 3011 and 3012 are respectively arranged on the first and second redistribution lines. A second surface of the micro through hole 3031 can be adaptively electrically connected to the sealing ring 102 as shown in FIG. 7 or FIG. 8. For example, when requiring the inductance to be reduced as much as possible, the second surface of the micro through hole 3031 may be directly connected to the sealing ring 102. When requiring the inductance to be slightly increased, the second surface of the micro through hole 3031 is not connected to the sealing ring 102. One of the first and second redistribution lines is connected to the first inductor arranged in the metal layers through a micro bump, and the other one of the first and second redistribution lines is connected to the grounding layer arranged in the metal layer through another micro bump. Alternatively, the other one of the first and second redistribution lines is connected to the first inductor arranged in the metal layers through another micro bump and then connected to the grounding layer.

It can be understood that a grounding layer is arranged in the metal layers of the packaging substrate, and one of the first and second redistribution lines is connected to the grounding layer arranged in the metal layer through a micro bump, and the other one of the first and second redistribution lines is connected to the grounding layer arranged in the metal layers through another micro bump, Alternatively, the other one of the first and second redistribution lines is connected to the first inductor arranged in the metal layers through another micro bump and then connected to the grounding layer.

It can be understood that the adaptive connection between the second surface of the micro through hole 3031 and the sealing ring mainly depends on the specific chip size, requirements on the chip performance, physical parameters of the sealing ring, the positional relationship between the sealing ring and the chip, and the inductance of the metal layer connected to the micro through hole 3031, the number of parallel resonant arms, which should be synthetically considered to determine whether to electrically connect the second surface of the micro through hole 3031 to the sealing ring.

It can be understood that an electrical connection can be established between the first and second functional modules through the third functional module which can, by using multiple redistribution lines and micro bumps, facilitate device layout and also reduce the additional inductance brought by the micro bumps, redistribution lines, and silicon through holes filled with metal materials. The electrical connection between the substrate and parallel resonators is achieved by multiple branches of the redistribution lines. Compared with a single branch, the multiple branches can reduce parasitic inductance, thereby reducing the additional inductance in the parallel resonant arms caused by the micro bumps and redistribution lines, and thus improving the edge roll-off.

As shown in FIG. 6, the surface of the first functional module arranged with a filter faces the second functional module. In this case, the second substrate not only serves as a cover plate, but also integrates the function of the third functional module that electrically connects the first and second functional modules.

It can be understood that when the surface of the first functional module arranged with the filter device faces away from the second functional module, a cover plate is arranged on the surface of the first substrate arranged with the filter device. For example, a second substrate may be provided as the cover plate. In this case, the third functional module may be separately arranged on another substrate, or arranged on the first substrate together with the first functional module. When the third functional module is arranged on the first substrate, the multiple micro through holes of the third functional module are arranged in the first substrate, and the multiple redistribution lines are arranged on the surface of the first substrate without the first functional module. The multiple redistribution lines are arranged with at least one micro bump, and are electrically connected to the second functional module through the micro bump.

The packaging structure of the filter in the present disclosure can not only reduce the production cost of the filter, but also enhance the out-of-band suppression near to a passband of the filter and improve the edge roll-off.

Second Embodiment

Figure 9:
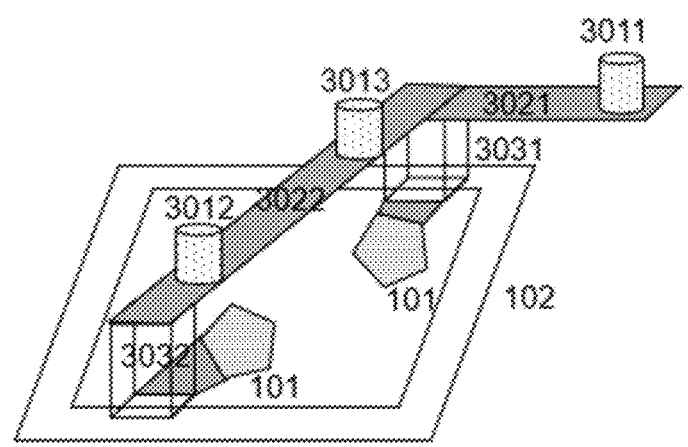
FIG. 9 is a perspective view of partial structures of a filter according to a second embodiment.

FIG. 9 illustrates a filter structure and a method according to a second embodiment in the present disclosure, where the same reference numerals represent the same components.

The main difference between the second embodiment and the first embodiment lies in that the layout design of the redistribution lines, micro bumps, and micro through holes is that a first part of a first redistribution line 3021 and a first part of a second redistribution line 3022 converge on a first surface of a micro through hole 3031 of a first parallel resonant arm, where a second part of the first redistribution line 3021 is provided with a micro bump 3011, and a second part of the second redistribution line 3022 contacts a first surface of the micro through hole 3032 of a second branch. The second redistribution line 3022 is provided with a micro bump near its first part and a micro bump near its second part. It can be understood that the micro bumps can be provided at other positions of the second redistribution line 3022 according to actual layout needs. The second surfaces of the micro through holes 3031 and 3032 may be both directly connected to the sealing ring as shown in FIG. 7 or FIG. 8, or neither is connected to the sealing ring, or at least one is connected to the sealing ring. The principle of the adaptive connection is the same as the first embodiment.

Third Embodiment

Figure 10:
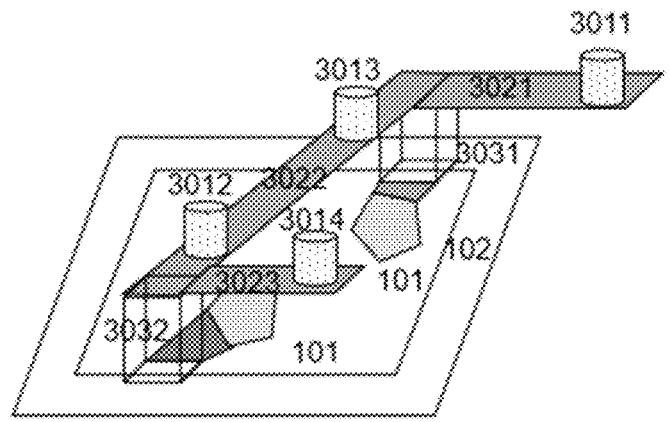
FIGS. 10 and 11 are perspective views of partial structures of a filter according to a third embodiment.
Figure 11:
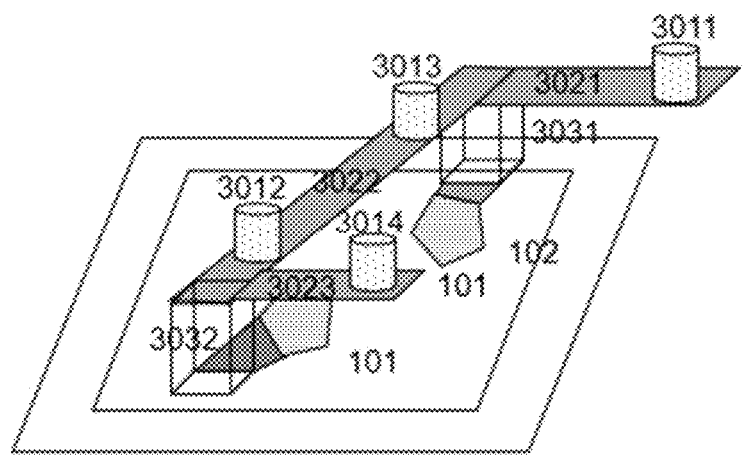

FIGS. 10 and 11 illustrate a filter structure and a method according to a third embodiment in the present disclosure, where the same reference numerals represent the same components.

The main difference between the third embodiment and the second embodiment lies in that the layout design of the redistribution lines, micro bumps, and micro through holes is that a first part of a first redistribution line 3021 and a first part of a second redistribution line 3022 converge on a first surface of a micro through hole 3031 of a first parallel resonant arm, and a second part of the second redistribution line 3022 and a first part of a third redistribution line 3023 converge on a first surface of a micro through hole 3032 of a second parallel resonant arm, where the extension direction of the third redistribution line 3023 is parallel to the extension direction of the first redistribution line 3021. It can be understood that the extension direction of the third redistribution line may not be parallel to the first redistribution line. The second part of the first redistribution line 3021 is provided with a micro bump 3011, the second redistribution line 3022 is provided with a micro bump 3013 near its first part and a micro bump 3012 near its second part. The second part of the third redistribution line 3023 is provided with a micro bump 3014. It can be understood that the micro bumps can be arranged according to specific layout needs. In an example, the second surface of the micro through hole 3031 is directly connected to the sealing ring as shown in FIG. 10, while the second surface of the micro through hole 3032 is not connected to the sealing ring as shown in FIG. 11.

Fourth Embodiment

Figure 12:
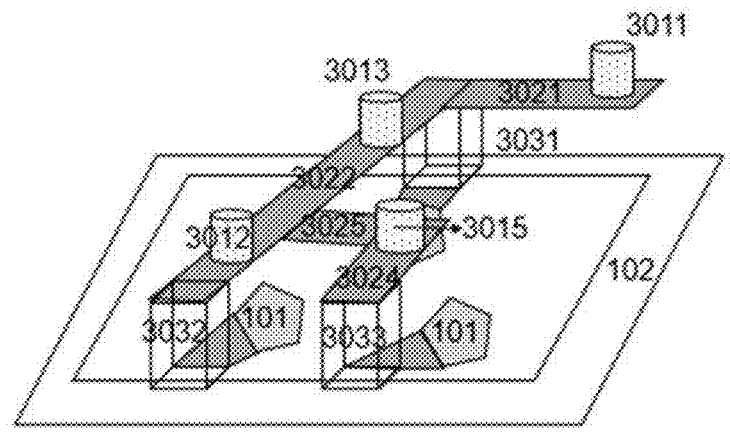
FIGS. 12 and 13 are perspective views of partial structures of a filter according to a fourth embodiment.
Figure 13:
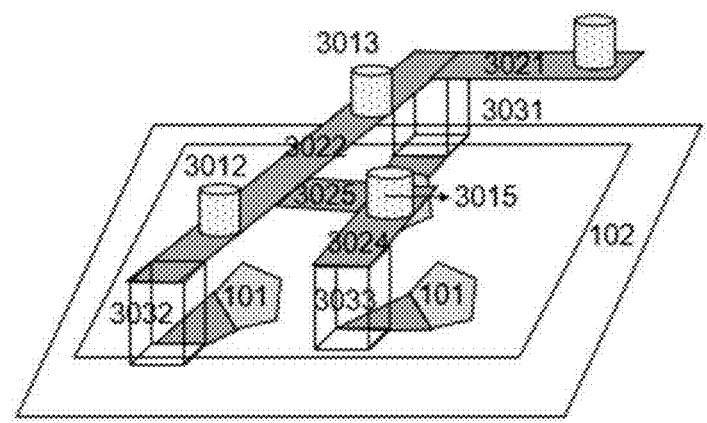

FIGS. 12 and 13 illustrate a filter structure and a method according to a fourth embodiment in the present disclosure, where the same reference numerals represent the same components.

The main difference between the fourth embodiment and the second embodiment lies in that the layout design of the redistribution lines, micro bumps, and micro through holes is that a first part of a first redistribution line 3021 and a first part of a second redistribution line 3022 converge on a first surface of a micro through hole 3031 of a first parallel resonant arm, and a first part of a fourth redistribution line 3024 converges on a first surface of a micro through hole 3033 of a third parallel resonant arm, where the extension direction of the fourth redistribution line 3024 is parallel to the extension direction of the second redistribution line 3022. Similarly, the extension direction of the fourth redistribution line may not be parallel to the second wiring. A first part of a fifth redistribution line 3025 converges at a position between the second and first parts of the second redistribution line. A second part of the fourth redistribution line 3024 overlaps with a second part of the fifth redistribution line 3025. A second part of the first redistribution line 3021 is provided with a micro bump 3011, the second redistribution line 3022 is provided with a micro bump 3012 near its first part and a micro bump 3013 near its second part. A micro bump 3015 is provided at a position where the fourth redistribution line 3024 and the fifth redistribution line 3025 converge. It can be understood that the positions of the micro bumps are only exemplary, and can be arranged according to specific layout needs. The second surfaces of the micro through hole 3031, the micro through hole 3032, and the micro through hole 3033 can be adaptively connected to the sealing ring as described in the aforementioned embodiment. For example, as shown in FIG. 12, the second surfaces of the micro through hole 3031, micro through hole 3032, and micro through hole 3033 are all connected to the sealing ring. Alternatively, at least one of the second surfaces of the micro through hole 3031, the micro through hole 3032, and the micro through hole 3033 is not connected to the sealing ring. As shown in FIG. 13, the second surface of the micro through hole 3033 is not connected to the sealing ring.

Fifth Embodiment

A filter structure and a method according to a fifth embodiment in the present disclosure are described below, where the same reference numerals represent the same components. The main difference between the fifth embodiment and the first embodiment lies in that the layout design of the redistribution lines, micro bumps, and micro through holes of the fifth embodiment is that: a first part of a second redistribution line 3022 and a third part of a first redistribution line 3021 converge on a first surface of a micro through hole 3031 of a first parallel resonant arm, where the third part of the first redistribution line 3021 is located between a first part and a second part of the first redistribution line 3021. Micro bumps 3012 are respectively arranged at the first and second parts of the first redistribution line 3021 and the second part of the second redistribution line 3022. The second surface of the micro through hole 3031 may be directly connected to the sealing ring or not connected to the sealing ring. It can be understood that in the fifth embodiment, three redistribution lines are involved, dividing the first redistribution line into two redistribution lines. Thus, the first part of the redistribution line 3021, the first part of the redistribution line 3022, and the first part of the other redistribution line converge on the first surface of the same micro through hole 3031. The second part of the redistribution line 3021, the second part of the redistribution line 3022, and the second part of the other redistribution line are respectively electrically connected to the second functional module through micro bumps.

Sixth Embodiment

Figure 14:
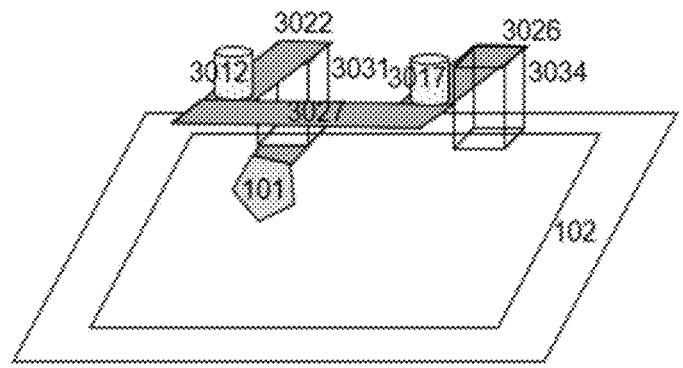
FIGS. 14 and 15 are perspective views of partial structures of a filter according to a sixth embodiment.
Figure 15:
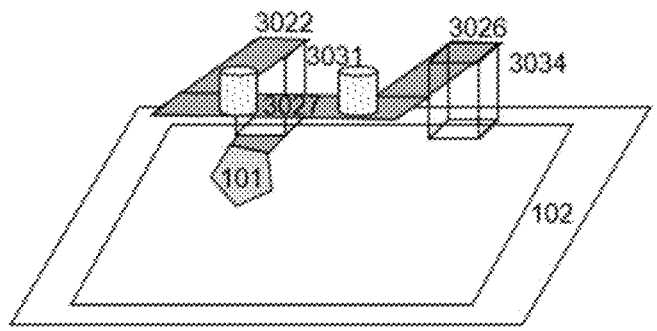

FIGS. 14 and 15 illustrate a filter structure and a method according to a sixth embodiment in the present disclosure, where the same reference numerals represent the same components.

Based on the aforementioned embodiment, in the sixth embodiment, the first part of the second redistribution line 3022 converges on the first surface of the micro through hole 3031 of the first parallel resonant arm. The first part of a sixth redistribution line 3026 converges on the first surface of the micro through hole 3034. The second surface of the micro through hole 3034 is not connected to any parallel resonant arm, so that the micro through hole 3034 is an independent micro through hole. The extension direction of the sixth redistribution line is parallel or not parallel to the extension direction of the second redistribution line. The seventh redistribution line 3027 has parts respectively connecting to the second redistribution line and the sixth redistribution line. As shown in FIG. 14, a micro bump 3012 is arranged on the second redistribution line and a micro bump 3017 is arranged on the sixth redistribution line. It can be understood that the micro bump can also be arranged between the first and second parts of the seventh redistribution line as shown in FIG. 15.

Similarly, the second surfaces of the micro through holes 3031 and 3034 may be both connected to the sealing ring as shown in FIGS. 14 to 15. It can be understood that one of or none of the second surfaces of the micro through hole 3031 and the micro through hole 3034 may be connected to the sealing ring.

Furthermore, in this embodiment, no other redistribution line is shown in the drawings, but it can be understood that the first, the third to the fifth redistribution lines can be added to this embodiment as described in the previous embodiment.

Seventh Embodiment

A filter is provided, which includes any one of the filters in the above embodiments. The filter may be used for an RF module. The RF module is a module capable of processing the fourth generation communication standard (4G), the fifth generation communication standard (5G) or a module capable of processing carrier aggregation and dual connection. For example, the RF module is a duplexer or a multiplexer.

The RF module may be used in a communication apparatus, such as a mobile phone, a personal digital assistant (PDA), an electronic game device, and a wearable terminal.

The above describes the technical solutions with reference to specific embodiments, but those skilled in the art should understand that these descriptions are exemplary and do not limit the scope of protection. It is understood that the disclosed technical solutions are not limited to a bulk acoustic wave filters. As long as a chip is connected to a packaging substrate through redistribution lines, the technical solution is applicable. Those skilled in the art can make various variations and modifications to the technical solutions based on the spirit and principles of the present disclosure, and these variations and modifications fall within the scope of protection.

The invention claimed is:

1. A semiconductor device, comprising:
a first functional module arranged on a first substrate and comprising a chip, an electrical connection component and a sealing ring, wherein the sealing ring surrounds the chip, and the chip is electrically connected to the electrical connection component;
a second functional module comprising a packaging substrate, wherein the packaging substrate comprises at least two metal layers and a dielectric layer between the at least two metal layers;
a third functional module comprising multiple redistribution lines and multiple micro through holes used for electrical connection between the first functional module and the second functional module, wherein the electrical connection component in the first functional module is electrically connected to the third functional module; and
a second substrate, wherein the second substrate is sealed with the first substrate,
wherein the multiple redistribution lines are provided with at least one micro bump, and at least two of the multiple redistribution lines intersect with each other, at least one of the multiple micro through holes is electrically connected to the second functional module through at least two different redistribution lines, the second functional module is electrically connected to the chip through the multiple redistribution lines, the multiple micro through holes and the electrical connection component.

2. The semiconductor device according to claim 1, wherein the third functional module is arranged on the second substrate, the multiple micro through holes of the third functional module are arranged in the second substrate, the multiple redistribution lines are arranged on a surface of the second substrate away from the first substrate, and the multiple redistribution lines are electrically connected to the second functional module through the at least one micro bump.

3. The semiconductor device according to claim 1, wherein
the multiple redistribution lines at least comprise a first redistribution line, a second redistribution line, and a third redistribution line;
a first part of the first redistribution line, a first part of the second redistribution line, and a first part of the third redistribution line converge on a first surface of a same micro through hole of the multiple micro through holes; and
a second part of the first redistribution line, a second part of the second redistribution line and a second part of the third redistribution line are electrically connected to the second functional module through the at least one micro bump.

4. The semiconductor device according to claim 1, wherein any one of the electrical connection component and the multiple micro through holes is electrically connected to the sealing ring or not electrically connected to the sealing ring.

5. The semiconductor device according to claim 4, wherein the at least one micro bump comprises a first micro bump and a second micro bump other than the first micro bump, a grounding layer is arranged in the at least two metal layers of the packaging substrate, and one of the at least two different redistribution lines is connected to the grounding layer arranged in the at least two metal layers through the first micro bump, wherein
the other one of the at least two different redistribution lines is connected to the grounding layer arranged in the at least two metal layers through the second micro bump; or
the other one of the at least two different redistribution lines is connected to a first inductor arranged in the at least two metal layers through the second micro bump, and then connected to the grounding layer.

6. The semiconductor device according to claim 4, wherein
the multiple micro through holes comprise at least one first independent micro through hole and a second micro through hole;
a surface of the first independent micro through hole is electrically connected to the sealing ring and is not electrically connected to the electrical connection component;
a surface of the second micro through hole is electrically connected to the electrical connection component and the sealing ring;
another surface of the first independent micro through hole is electrically connected to another surface of the second micro through hole through at least one redistribution line; and
the at least one micro bump comprises at least two micro bumps arranged on a redistribution line between the first independent micro through hole and the second micro through hole.

7. The semiconductor device according to claim 4, wherein the chip is an acoustic wave device chip.

8. The semiconductor device according to claim 7, wherein the acoustic wave device chip comprises multiple bulk acoustic wave resonators.

9. The semiconductor device according to claim 4, wherein the at least one micro bump comprises a first micro bump and a second micro bump other than the first micro bump, an element and a grounding layer are arranged in the at least two metal layers of the packaging substrate, and one of the at least two different redistribution lines is connected to the element arranged in the at least two metal layers through the first micro bump, wherein
the other one of the at least two different redistribution lines is connected to the grounding layer arranged in the at least two metal layers through the second micro bump; or the other one of the at least two different redistribution lines is connected to a first inductor arranged in the at least two metal layers through the second micro bump, and then connected to the grounding layer.

10. The semiconductor device according to claim 9, wherein the element is a second inductor.

11. A producing method for a semiconductor device, comprising:
a producing process of a first functional module, comprising forming a chip, an electrical connection component and a sealing ring on a first substrate, wherein the sealing ring surrounds the chip, and the chip is electrically connected to the electrical connection component;
a producing process of a second functional module, comprising providing a packaging substrate, wherein the packaging substrate comprises at least two metal layers and a dielectric layer between the at least two metal layers;
a producing process of a third functional module, comprising forming multiple redistribution lines and multiple micro through holes used for electrical connection between the first functional module and the second functional module, wherein the electrical connection component in the first functional module is electrically connected to the third functional module; and
providing a second substrate, wherein the second substrate is sealed with the first substrate,
wherein the multiple redistribution lines are provided with at least one micro bump, and at least two of the multiple redistribution lines intersect with each other, at least one of the multiple micro through holes is electrically connected to the second functional module through at least two different redistribution lines, the second functional module is electrically connected to the chip through the multiple redistribution lines, the multiple micro through holes and the electrical connection component.

12. The producing method according to claim 11, wherein the third functional module is arranged on the second substrate, the multiple micro through holes of the third functional module are arranged in the second substrate, the multiple redistribution lines are arranged on a surface of the second substrate away from the first substrate, and the multiple redistribution lines are electrically connected to the second functional module through the at least one micro bump.

13. The producing method according to claim 11, wherein
the multiple redistribution lines at least comprise a first redistribution line, a second redistribution line, and a third redistribution line;
a first part of the first redistribution line, a first part of the second redistribution line, and a first part of the third redistribution line converge on a first surface of a same micro through hole of the multiple micro through holes; and
a second part of the first redistribution line, a second part of the second redistribution line and a second part of the third redistribution line are electrically connected to the second functional module through the at least one micro bump.

14. The producing method according to claim 11, wherein any one of the electrical connection component and the multiple micro through holes is electrically connected to the sealing ring or not electrically connected to the sealing ring.

15. The producing method according to claim 14, wherein the multiple micro through holes comprise at least one first independent micro through hole and a second micro through hole;
a surface of the first independent micro through hole is electrically connected to the sealing ring and is not electrically connected to the electrical connection component;
a surface of the second micro through hole is electrically connected to the electrical connection component and the sealing ring;
another surface of the first independent micro through hole is electrically connected to another surface of the second micro through hole through at least one redistribution line; and
the at least one micro bump comprises at least two micro bumps arranged on a redistribution line between the first independent micro through hole and the second micro through hole.

16. The producing method according to claim 14, wherein the chip comprises an acoustic wave device chip.

17. The producing method according to claim 16, wherein the acoustic wave device chip comprises multiple bulk acoustic wave resonators.

18. The producing method according to claim 14, wherein the at least one micro bump comprises a first micro bump and a second micro bump other than the first micro bump, an element and a grounding layer are arranged in the at least two metal layers of the packaging substrate, and one of the at least two different redistribution lines is connected to the element arranged in the at least two metal layers through the first micro bump, wherein
the other one of the at least two different redistribution lines is connected to the grounding layer arranged in the at least two metal layers through the second micro bump; or
the other one of the at least two different redistribution lines is connected to a first inductor arranged in the at least two metal layers through the second micro bump, and then connected to the grounding layer.

19. The producing method according to claim 18, wherein the element is a second inductor.

20. The producing method according to claim 14, wherein the at least one micro bump comprises a first micro bump and a second micro bump other than the first micro bump, a grounding layer is arranged in the at least two metal layers of the packaging substrate, and one of the at least two different redistribution lines is connected to the grounding layer arranged in the at least two metal layers through the first micro bump, wherein
the other one of the at least two different redistribution lines is connected to the grounding layer arranged in the at least two metal layers through the second micro bump; or
the other one of the at least two different redistribution lines is connected to a first inductor arranged in the at least two metal layers through the second micro bump, and then connected to the grounding layer.

21. A communication apparatus, comprising a semiconductor device, wherein the semiconductor device comprises
a first functional module arranged on a first substrate and comprising a chip, an electrical connection component and a sealing ring, wherein the sealing ring surrounds the chip, and the chip is electrically connected to the electrical connection component;

a second functional module comprising a packaging substrate, wherein the packaging substrate comprises at least two metal layers and a dielectric layer between the at least two metal layers;

a third functional module comprising multiple redistribution lines and multiple micro through holes used for electrical connection between the first functional module and the second functional module, wherein the electrical connection component in the first functional module is electrically connected to the third functional module; and a second substrate, wherein the second substrate is sealed with the first substrate, wherein the multiple redistribution lines are provided with at least one micro bump, and at least two of the multiple redistribution lines intersect with each other, at least one of the multiple micro through holes is electrically connected to the second functional module through at least two different redistribution lines, the second functional module is electrically connected to the chip through the multiple redistribution lines, the multiple micro through holes and the electrical connection component.

\* \* \* \* \*